(12) United States Patent
Sugie et al.

(10) Patent No.: US 6,468,716 B1
(45) Date of Patent: Oct. 22, 2002

(54) COVER FILM FOR DRY FILM RESIST

(75) Inventors: Takeshi Sugie, Shiga-ken (JP); Takatoshi Miki, Shiga-ken (JP)

(73) Assignee: Mitsubishi Polyester Film, Tokyo (JP)

( * ) Notice: Subject to any disclaimer, the term of this patent is extended or adjusted under 35 U.S.C. 154(b) by 0 days.

(21) Appl. No.: 09/521,909

(22) Filed: Mar. 9, 2000

(30) Foreign Application Priority Data

Mar. 10, 1999 (JP) .............................. 11-062863

(51) Int. Cl.[7] .......................... G03C 1/76; B32B 27/08; B32B 27/32; G03F 7/11
(52) U.S. Cl. ................... 430/273.1; 428/484; 428/480; 428/500; 428/515; 428/543; 428/40.5; 428/41.7; 428/41.8; 428/41.3
(58) Field of Search ..................... 430/273.1; 428/480, 428/484, 500, 515, 543, 40.5, 41.7, 41.8, 41.3

(56) References Cited

U.S. PATENT DOCUMENTS

| | | | | | |
|---|---|---|---|---|---|
| 4,983,445 A | * | 1/1991 | Ueyama | .................. | 428/212 |
| 5,219,694 A | * | 6/1993 | Anno et al. | .............. | 430/106.6 |
| 5,437,900 A | * | 8/1995 | Kuzowski | .................. | 428/36.1 |
| 5,708,941 A | * | 1/1998 | Koga et al. | .................. | 399/272 |
| 5,728,645 A | * | 3/1998 | Oshima et al. | .............. | 503/204 |
| 5,747,174 A | * | 5/1998 | Kimura et al. | .............. | 428/480 |
| 5,935,520 A | * | 8/1999 | Fujisaki et al. | ................ | 422/58 |
| 6,010,822 A | * | 1/2000 | Huang | ..................... | 430/273.1 |
| 6,225,391 B1 | * | 5/2001 | Parthasarathy et al. | ..... | 524/269 |

FOREIGN PATENT DOCUMENTS

| EP | 0487727 | 2/1991 |
|---|---|---|
| JP | XP002901025 | 10/1994 |
| JP | XP002901026 | 2/1998 |

OTHER PUBLICATIONS

European Search Report.

* cited by examiner

*Primary Examiner*—Janet Baxter
*Assistant Examiner*—Sin J. Lee
(74) *Attorney, Agent, or Firm*—David G. Conlin; John B. Alexander; Edwards & Angell, LLP

(57) ABSTRACT

The present invention relates to a cover film for dry film resist comprising a base film and at least one wax-containing coating layer on at least one side of a base film, the water droplet contact angle of the surface of said coating layer being not less than 80°.

13 Claims, No Drawings

COVER FILM FOR DRY FILM RESIST

BACKGROUND OF THE INVENTION

The present invention relates to a cover film for dry film resists. More detail, the present invention relates to a cover film for dry film resists having excellent releasability and surface properties.

Recently, miniaturization of electronic devices has raised request for higher density of printed wiring boards, and it has become an urgent necessity to make finer the conductor patterns formed on the insulated substrate surface.

The dry film resist used in manufacture of the printed wiring boards has a three-layer structure of carrier film/photoresist/cover film, and polyethylene film has been used as the cover film for such dry film resists. However, thickness distribution and tendency to form fish-eyes of the polyethylene film obstruct the realization of higher density of the printed wiring boards.

Dry film resist is produced by coating a photoresist layer on a carrier film and, after drying the formed photoresist layer, laminating a cover film thereon. The photoresist is flexible when the cover film is laminated. Therefore, if unevenness is formed on the cover film surface due to fish-eyes, it is transferred to the photoresist layer to form similar unevenness on its surface, causing improper adhesion of the photoresist layer to the insulated substrate, which leads to a defective conductor pattern.

The polyethylene film is molded by melt extrusion, but because of high melt viscosity, it is hardly possible to filter the melt by a high-performance filter when the melt is extruded, so that the presence of fish-eyes or the like in the molded sheet is unavoidable. Further, the inflation method generally used for forming the polyethylene films is incapable of providing a uniform film thickness and also subject to the problem of deflection of film thickness.

Thus, it has increasingly become difficult to comply with the request for higher density of the printed wiring boards by using polyethylene for the cover film.

Japanese Patent Application Laid-Open (KOKAI) No. 6-297565 proposes use of a polyester film for dry film resists in place of a polyethylene film.

In the polyester film according to JP-A-6-297565, however, in order to provide the same flexibility as the polyethylene film for securing releasability, a release agent is coated on the film to afford the desired releasability and a copolymer component such as a long-chain aliphatic dicarboxylic acid and/or a polyolefin are blended to provide flexibility. Since the said film is unsatisfactory in releasability provided by the coating, it needs to impart flexibility to the base film. However, since a specific material is used for the base film, the above polyester film involved such problems as difficulties in regenerating the film and high production cost.

As a result of the present inventors' earnest studies to solve the above problem, it has been found that a film comprising a base film and a wax-containing coating layer and, having a specific water droplet contact angle is suited as a cover film for dry film resists.

The present invention has been attained on the basis of the above finding.

SUMMARY OF THE INVENTION

The object of the present invention is to provide a cover film for dry film resists having excellent releasability and surface properties.

To attain the above aim, in an aspect of the present invention, there is provided a cover film for dry film resist comprising a base film and at least one wax-containing coating layer on at least one side of a base film, the water droplet contact angle of the surface of said coating layer being not less than 80°.

DETAILED DESCRIPTION OF THE INVENTION

The present invention will be described in detail below.

In the cover film for dry film resists according to the present invention, the resin constituting the base film is preferably a polyester. The term "polyester" used in the present invention refers to highly crystalline linear saturated polyesters synthesized from aromatic dibasic acids or ester-forming derivatives thereof and glycols.

The dicarboxylic acids usable as a component of the polyesters in the present invention include aromatic dicarboxylic acids such as terephthalic acid, isophthalic acid, orthophthalic acid, naphthalenedicarboxylic acid, paraphenylenedicarboxylic acid and derivatives thereof, alicyclic dicarboxylic acids such as 1,4-cyclohexanedicarboxylic acid and its derivatives, aliphatic dicarboxylic acids such as succinic acid, adipic acid, suberic acid, sebacic acid, dodecanedionic acid and derivatives thereof, and polyfunctional acids such as trimellitic acid, pyromellitic acid and derivatives thereof. The diols usable as another component of the polyesters include ethylene glycol, 1,3-propylene glycol, 1,4-butanediol, 1,6-hexanediol, neopentyl glycol, diethylene glycol, triethylene glycol, polyethylene glycol, polytetramethylene glycol, 1,4-cyclohexanedimethanol and derivatives thereof.

The preferred polyester for use in the present invention is polyethylene terephthalate.

The haze of the cover film for dry film resists according to the present invention is not more than 7%, preferably not more than 4%. If the haze exceeds 7%, it tends to become difficult to detect defects such as a coating hole in the coating of the photoresist.

The thickness of the cover film for dry film resists according to the present invention is preferably not more than 25 $\mu$m, more preferably not more than 20 $\mu$m, even more preferably not more than 16 $\mu$m. If the cover film thickness is more than 25 $\mu$m, the photoresist surface may be damaged when the cover film is released, because the film is too firm. The lower limit of the cover film thickness is usually 3.5 $\mu$m.

In order to provide desired roughness to the surface of the obtained film in the present invention, it is preferable to add fine particles to the film or the coating layer. The particles of various materials such as silica, alumina, kaolin, calcium carbonate, barium salts, etc., can be used for this purpose.

The surface roughness of the coating layer is preferably 0.005 to 0.2 $\mu$m, more preferably 0.02 to 0.1 $\mu$m. If the surface roughness is less than 0.005 $\mu$m, the winding properties of the obtained film tend to deteriorate, and if the surface roughness exceeds 0.2 $\mu$m, air traps tend to form between the cover film and the photoresist to cause hardening of the resist by the reaction between oxygen and resist.

In the cover film for dry film resists according to the present invention, a wax is blended in the coating solution used for forming the coating layer. As such a wax, there can be used natural waxes such as vegetable waxes, animal waxes, mineral waxes and petroleum waxes, as well as synthetic waxes such as synthetic hydrocarbons, modified waxes and hydrogenated waxes. Of these waxes, polyolefin waxes are preferably used. For instance, the compounds having as the basic skeleton a polyolefin compound comprising a polymer or copolymer of an unsaturated hydrocarbon such as ethylene, propylene, 1-butene, 4-methyl-1-pentene or the like are used as a solution or a dispersion.

More specific examples of such compounds include polyethylene, polypropylene, poly-1-butene, poly-4-methyl-1-pentene, ethylene-propylene copolymer, ethylene-1-butene copolymer, propylene-1-butene copolymer and such.

In the present invention, it is preferable to use polyolefins with an acid value of 10 to 50 having an active hydrogen group at the terminal, or to use polyethylene oxide or polypropylene oxide. The "acid value" referred to herein means the number of mg of potassium hydroxide needed for neutralizing the free fatty acids contained in 1 g of the specimen. It is a value proportional to the amount of the free fatty acids contained in the wax. When using a polyolefin compound with an acid value of less than 10, although releasability of the cover film from the photoresist is satisfactory, the coating film strength of the coating layer tends to lower and part of the coating layer may be transferred to the resist layer after release of the cover film, causing a reduction of adhesion when the resist layer is laminated on the insulated substrate. In case of using a polyolefin compound with an acid value exceeding 50, although no transfer of the coating layer to the resist layer occurs, releasability from the photoresist may be deteriorated.

Specifically, a compound having as its basic skeleton a polyolefin compound comprising, for example, an ethylene or propylene polymer and/or copolymer and having an active hydrogen group such as carboxyl group, hydroxyl group or amino group at the terminal is used in the form of a solution or dispersion. Especially, polyethylene oxide wax, polypropylene oxide wax, ethylene oxide-propylene copolymer wax and the like are preferably used.

The wax (a polyolefin compound such as mentioned above) is blended in an amount of usually 1 to 100 parts by weight, preferably 20 to 100 parts by weight, based on 100 parts by weight of the coating solution used for forming the coating layer. If the amount of the wax (a polyolef in compound) blended is less than 20 parts by weight, releasability of the cover film from the photoresist tends to lower.

In order to coat the wax on the film with good appearance and improve adhesion between the coating layer and the film, it is preferable to mix a crosslinking agent in the coating solution. As such a crosslinking agent, it is possible to use, for example, melamine-type, amide-type and acrylamide-type compounds, epoxy compounds, polyisocyanates, blocked polyisocyanates, and carbodimide compounds.

The crosslinking agent is blended in an amount of usually 1 to 50 parts by weight, preferably 5 to 30 parts by weight, based on 100 parts by weight of the coating solution. When the amount of the crosslinking agent blended exceeds 30 parts by weight, releasability of the cover film from the photoresist tends to deteriorate, and when the amount of the crosslinking agent is less than 1 part by weight, coating film strength of the coating layer tends to lower.

In the said coating solution, in order to improve its coating performance, there may be contained lubricant, antistatic agent, defoaming agent, particles, etc., within limits not affecting the effect of the present invention.

As the coating means, it is possible to use various types of coating machines including reverse roll coater, gravure coater, rod coater, air doctor coater, etc., such as illustrated in Y. Harasaki: Coating System, Maki Shoten, 1979, and other types of coating equipment.

In the present invention, the coating layer can be provided by an in-line coating system in which coating is conducted in the film forming process, an off-line coating system in which coating is performed after formation of the film, or other systems, but the in-line coating system is preferred.

In-line coating is a method in which coating is conducted in the polyester film forming process, more specifically a method in which coating is performed at any suitable stage in the process from melt extrusion of polyester to take-up of the film after biaxial stretching and heat setting. Usually, coating is made on a substantially amorphous-state non-stretched sheet obtained by rapidly cooling the molten extrudate, or a monoaxially stretched film obtained by stretching the said sheet monoaxially in the longitudinal (machine) direction, or a biaxially stretched film before heat setting. Especially preferably, coating is performed on a monoaxially stretched film, and then the film is further stretched in the transverse direction. This method is advantageous in terms of production cost since film forming and drying of the coating layer can be accomplished simultaneously. Also, thin film coating is easy to perform because stretching is conducted after coating, and further, the coating layer and the polyester film adhere securely to each other since the heat treatment applied after coating is conducted at a high temperature which is inapplicable with the other methods.

The water droplet contact angle of the coating layer surface of the cover film according to the present invention is not less than 80°, preferably not less than 90°. If the contact angle is less than 80°, releasability of the cover film deteriorates, making the photoresist surface vulnerable to flawing when the cover film is released.

As described above, the present invention provides a cover film for dry film resists with excellent releasability and surface properties, and its industrial value is high.

EXAMPLES

The present invention will be further illustrated by the following examples, but it should be understood that the invention is not restricted to these examples.

The properties of the film according to the present invention were evaluated in the following way. First, on a biaxially stretched polyester film (carrier film) was coated a photoresist layer, and after dried, the laminate was attached under roll pressure on the coated side of the cover film for dry film resist according to the present invention to obtain a carrier film/photoresist/cover film three-layer structured dry film resist, and it was subjected to evaluations on the following items.

(1) Water Droplet Contact Angle

The contact angle made by the coating layer surface of the sample film with a distilled water droplet thereon was measured by a contact angle meter Model CA-DT-A (mfd. by Kyowa Kaimen Kagaku KK) under the conditions of 23° C. and 50% RH. The contact angle was measured at two points (left and right points) of each of the three samples, and the average of six measurements was shown as contact angle. The water droplet was 2 mm in diameter, and the indicated value on the meter was read one minute after dropping of water.

(2) Haze

Haze of the film was measured according to JIS-7105 using an integrating spherical turbidimeter NHD-20D mfd. by Nippon Denshoku Kogyo KK.

(3) Surface Roughness (Ra)

The center line average roughness Ra ($\mu$m) was shown as surface roughness. It was determined in the following way using a surface roughness tester (SE-3F) mfd. by Kosaka Kenkyusho Ltd. A portion with a standard length L (2.5 mm) was drawn out from a sectional curve of the sample film, and when the roughness curve (y) was expressed as $y=f(x)$ in the x and y coordinates with the center line of the drawn out portion represented by the x-axis and the direction of longitudinal magnification represented by the y-axis, the value given from the following equation was expressed as surface roughness in $\mu$m. The center line average roughness was measured with 10 sectional curves from the sample film surface, and the average of the values of center line average roughness of the drawn out portion determined from the 10 sectional curves was shown. Measurement was made under the following conditions: feeler tip radius=2 μm; load=30 mg; cut-off=0.08 mm.

$$Ra=(1/L)\int_0^L |f(x)|dx$$

(4) Evaluation of Releasability

The sample film was cut to a 15 mm wide piece and the cover film was released by a tensile tester, examining releasability, resist surface condition, etc., and evaluating them according to the following criterion.

⊚: Adhesive force was less than 15 g/cm and releasing could be performed very smoothly with no damage given to the resist surface.

○: Adhesive force was 15 to 100 g/cm and no damage was given to the resist surface.

Δ: Adhesive force was more than 100 g/cm. Although releasing was awkward, it was not so bad as to cause damage to the resist surface.

X: Releasing was not smooth and damage was given to the resist surface.

(5) Adhesion of the resist layer to the insulated substrate

⊚: When the resist layer is laminated on the insulated substrate, they adhere excellently to each other and the resist layer won't exfoliate.

○: When the resist layer is laminated on the insulated substrate, they adhere well to each other and the resist layer does not exfoliate easily.

Δ: When the resist layer is laminated on the insulated substrate, the resist layer exfoliates only at a few locations.

X: When the resist layer is laminated on the insulated substrate, they do not adhere well and the resist layer easily exfoliates.

(6) Stability of Dry Film Resist After Lamination of Cover Film

The cover film for dry film resist according to the present invention was laminated on the photoresist layer and rolled up. The roll was left in a cold and dark place for about 2 months and then the following items were examined and evaluated.

A. Hardening of Resist Layer

⊚: The resist layer is not hardened at all.

○: Only part of the surface of the resist layer is hardened, but it does not give any influence on the performance of the dry film resist.

Δ: Only part of the surface of the resist layer is hardened.

X: The surface of the resist layer is entirely hardened.

B. Winding Properties of Dry Film Resist

⊚: There takes place no stiffening or telescoping of the resist layer in rolling, and the roll is perfectly free of wrinkles.

○: There takes place substantially no stiffening or telescoping of the resist layer in rolling, and the roll is almost free of wrinkles.

Δ: There partly takes place stiffening of the resist layer in rolling, and the roll has wrinkles in part.

X: There takes place stiffening of the resist layer in rolling and the roll has wrinkles.

(7) General Evaluation

From the results of evaluation on the above items, the performance of the sample films as a cover film for dry film resists was evaluated according to the 5-point grading system. General evaluation point "5" is given to the most excellent film as a cover film for dry film resist. General evaluation point "1" designates the worst film. The films with general evaluation point of "2" or above are acceptable for use as a cover film for dry film resist.

Example 1

A polyester having an inherent viscosity of 0.65 and containing 1,000 ppm of amorphous silica having an average particle size of 2 μm was melted at 295° C., extruded as a sheet onto a cold casting drum and solidified to form a non-oriented sheet. This sheet was stretched 3.6 times in the machine direction at 90° C., then coated with a coating solution comprising a polyolefin compound and a crosslinking agent specified below, passed through a tenter for preheating and transverse stretching by 4 times at 90° C., and heat treated at 230° C. for 10 seconds to give a 16 μm thick polyester film. This film was laminated on a photoresist layer to obtain a dry film resist having a carrier film/photoresist/cover film three-layer structure, and it was evaluated in the manner described above. A 16 μm polyethylene terephthalate film was used as the carrier film.

Coating Solution Composition

Polyolefin compound: polyethylene oxide emulsion having an acid value of 30 . . . 80 parts by weight Crosslinking agent: alkylolmelamine . . . 20 parts by weight As is seen from the results shown in Table 1, the tested samples of cover film for dry film resist according to the present invention had excellent releasability, showed good adhesion of the resist layer to the insulated substrate and gave good results of evaluation on any of the items examined.

Comparative Example 1

The same procedure as defined in Example 1 was conducted except that no coating solution was applied to obtain a film. However, the water droplet contact angle of the cover film surface was only 65°, and the adhesive force between the photoresist and the cover film was large, so the cover film could not be easily released from the photoresist layer.

Comparative Example 2

A film was formed under the same conditions as used in Example 1 except that the coating solution composition comprised 100 parts by weight of the crosslinking agent.

The water droplet contact angle of the coating layer surface of the obtained film was 66°, and the adhesive force between the photoresist and the cover film was large, so the cover film could not be easily released from the photoresist layer.

Comparative Example 3

A film was formed under the same conditions as used in Example 1 except that the coating solution composition comprised 100 parts by weight of polyethylene oxide having an acid value of 80.

The water droplet contact angle of the coating layer surface of the obtained film was 72°, and the adhesive force between the photoresist and the cover film was large, so the cover film could not be easily released from the photoresist layer.

Examples 2 to 5

Films were formed under the same conditions as used in Example 1 except that the polyolefin compound was replaced by the waxes specified below:

Waxes
  Polyethylene oxide with an acid value of 15 (Example 2)
  Polyethylene oxide with an acid value of 45 (Example 3)
  Polyethylene oxide with an acid value of 5 (Example 4)
  Polyethylene oxide with an acid value of 55 (Example 5)

Examples 6 and 7

Films were formed under the same conditions as used in Example 1 except that the amount of amorphous silica added to the cover film was changed as specified below:
Amount of Amorphous Silica Added
  5,000 ppm (Example 6)
  100 ppm (Example 7)
  10,000 ppm (Example 8)
  20 ppm (Example 9)
The obtained results are shown collectively in Table 1.

TABLE 1

| | Example 1 | Example 2 | Example 3 | Example 4 |
|---|---|---|---|---|
| Contact angle with water droplet | 95 | 97 | 88 | 98 |
| Haze | 4 | 4 | 4 | 4 |
| Surface roughness × $10^3$ | 50 | 50 | 50 | 50 |
| Releasability | ⊚ | ⊚ | ○ | ⊚ |
| Adhesion | ⊚ | ○ | ⊚ | Δ |
| Hardening of resist | ⊚ | ⊚ | ⊚ | ⊚ |
| Winding characteristics | ⊚ | ⊚ | ⊚ | ⊚ |
| General evaluation | 5 | 5 | 5 | 3 |

| | Example 5 | Example 6 | Example 7 | Example 8 |
|---|---|---|---|---|
| Contact angle with water droplet | 85 | 96 | 92 | 96 |
| Haze | 4 | 7 | 3 | 9 |
| Surface roughness × $10^3$ | 50 | 200 | 5 | 250 |
| Releasability | Δ | ⊚ | ⊚ | ⊚ |
| Adhesion | ⊚ | ⊚ | ⊚ | ⊚ |
| Hardening of resist | ⊚ | ○ | ⊚ | Δ |
| Winding characteristics | ⊚ | ⊚ | ○ | ⊚ |
| General evaluation | 3 | 5 | 5 | 3 |

| | Example 9 | Comp. Example 1 | Comp. Example 2 | Comp. Example 3 |
|---|---|---|---|---|
| Contact angle with water droplet | 92 | 65 | 66 | 72 |
| Haze | 2 | 3 | 4 | 4 |
| Surface roughness × $10^3$ | 3 | 50 | 50 | 50 |
| Releasability | ⊚ | X | X | X |
| Adhesion | ⊚ | ⊚ | ⊚ | ⊚ |
| Hardening of resist | ⊚ | ⊚ | ⊚ | ⊚ |
| Winding characteristics | Δ | ⊚ | ⊚ | ⊚ |
| General evaluation | 3 | 1 | 1 | 1 |

What is claimed is:

1. A dry film resist-cover film comprising a polyester base film and at least one wax-containing coating layer on at least one side of the base film, the water droplet contact angle of the surface of said coating layer being not less than 80°, said wax contained in the coating layer being a polyolefin-based compound with an acid value of 10 to 50, and said dry film resist-cover film having a haze of not more than 7%.

2. A dry film resist-cover film according to claim 1, having a thickness of 4 to 25 μm.

3. A dry film resist-cover film according to claim 1, wherein the surface roughness of the coating layer is 0.005 to 0.2 μm.

4. A dry film resist-cover film according to claim 1, wherein the polyolefin-based compound is polyethylene, polypropylene, poly-1-butene, poly-4-methyl-1-pentene, ethylene-propylene copolymer, ethylene-1-butene copolymer or propylene-1butene copolymer, each of which has an active hydrogen group at the terminal.

5. A dry film resist-cover film according to claim 1, wherein the polyolefin-based compound is polyethylene, polypropylene or ethylene-propylene copolymer, each of which has an active hydrogen group at the terminal.

6. A dry film resist-cover film according to claim 1, wherein the polyolefin-based compound has an active hydrogen group at the terminal.

7. A dry film resist-cover film according to claim 6, wherein the active hydrogen group is carboxyl group, hydroxyl group or amino group.

8. A dry film resist-cover film comprising a polyester base film and at east one wax-containing coating layer on at least one side or the base film, the water droplet contact angle of the surface of said coating layer being not less than 80°, said wax contained in the coating layer being a polyolefin-based compound with an acid value of 10 to 50, and the surface roughness of the coating layer being 0.005 to 0.2 μm.

9. A dry film resist-cover film according to claim 8, having a thickness of 4 to 25 μm.

10. A dry film resist-cover film according to claim 8, wherein the polyolefin-based compound is polyethylene, polypropylene, poly-1-butene, poly-4-methyl-1-pentene, ethylene-propylene copolymer, ethylene-1-butene copolymer or propylene-1-butene copolymer, each of which has an active hydrogen group at the terminal.

11. A dry film resist-cover film according to claim 8, wherein the polyolefin-based compound is polyethylene, polypropylene or ethylene-propylene copolymer, each of which has an active hydrogen group at the terminal.

12. A dry film resist-cover film according to claim 8, wherein the polyolefin-based compound has an active hydrogen group at the terminal.

13. A dry film resist-cover film according to claim 8, wherein the active hydrogen group is carboxyl group, hydroxyl group or amino group.

* * * * *

UNITED STATES PATENT AND TRADEMARK OFFICE
CERTIFICATE OF CORRECTION

PATENT NO.   : 6,468,716 B1
DATED        : October 22, 2002
INVENTOR(S)  : Takeshi Sugie and Takatoshi Miki It is certified that error appears in the above-identified patent and that said Letters Patent is hereby corrected as shown below:

<u>Title page,</u>
Delete "[73] Mitsubishi Polyester Film" and insert -- [73] Mitsubishi Polyester Film Corporation --.

Signed and Sealed this

Twenty-fifth Day of February, 2003

JAMES E. ROGAN
*Director of the United States Patent and Trademark Office*